United States Patent [19]

Anthony

[11] Patent Number: 4,853,080

[45] Date of Patent: Aug. 1, 1989

[54] LIFT-OFF PROCESS FOR PATTERNING SHIELDS IN THIN MAGNETIC RECORDING HEADS

[75] Inventor: Thomas C. Anthony, Sunnyvale, Calif.

[73] Assignee: Hewlett-Packard, Palo Alto, Calif.

[21] Appl. No.: 284,166

[22] Filed: Dec. 14, 1988

[51] Int. Cl.$^4$ .................... B44C 1/22; B29C 37/00; C03C 15/00; B05D 5/12

[52] U.S. Cl. .................... 156/637; 156/643; 156/646; 156/651; 156/655; 156/661.1; 156/668; 204/192.3; 204/192.32; 427/131; 427/259; 427/282

[58] Field of Search ............... 427/128, 129, 131–132, 427/258, 259, 272, 282; 156/655, 656, 661.1, 668, 637, 643, 646, 651; 204/192.15, 192.16, 192.2, 192.3, 192.31, 192.32, 192.35; 360/110, 122; 430/313, 314

[56] References Cited

U.S. PATENT DOCUMENTS

| | | | |
|---|---|---|---|
| 4,202,914 | 5/1980 | Havas et al. | 427/38 |
| 4,218,532 | 8/1980 | Dunkleberger | 430/314 |
| 4,481,071 | 11/1984 | Anderson et al. | 156/656 |
| 4,533,431 | 6/1985 | Dargent | 156/643 |
| 4,568,411 | 2/1986 | Martin | 156/655 |
| 4,710,263 | 12/1987 | Kato | 156/637 |

Primary Examiner—William A. Powell
Attorney, Agent, or Firm—William H. F. Howard

[57] ABSTRACT

A lift-off process for patterning bottom shields used in thin film magnetic recording heads. The lift-off process comprises the steps of depositing a first layer of resist material (22) on a substrate (20) and hard baking the resist material (22). A transfer layer (24) is deposited over the first layer of resist material (22) and a second layer of resist material (26) is deposited on top of the transfer layer (24). The second layer of resist material (24) is then patterned and developed. The patterned structure is then etched to form a mask structure wherein the transfer layer (24) overhangs the first layer of resist material (22). An adhesion layer (30) and an amorphous magnetic alloy material (32) are then sequentially deposited on the exposed surface of the substrate (20). The amorphous magnetic alloy material (32) is sputter deposited at a pressure of about 3.4 mT, a condition that resists the stress in the amorphous alloy material to less than $10^9$ dynes per square centimeter. Low stress is required to preserve the integrity of the mask structure. The mask layers and unwanted amorphous allow material (32) are removed using ultrasonic agitation in acetone. This process results in a shield pattern having tapered sidewalls which enhance the reliability of subsequently deposited conductor metallization.

24 Claims, 1 Drawing Sheet

LIFT-OFF PROCESS FOR PATTERNING SHIELDS IN THIN MAGNETIC RECORDING HEADS

BACKGROUND

The present invention relates generally to processes of fabricating thin film recording heads, and more particularly to a lift-off process for patterning shields in such recording heads.

Conventional thin film recording heads are processed such that magnetic alloys employed as the shields are either vacuum deposited and subsequently patterned by chemical etching or ion etching, or plated, in which case the patterns are defined with a resist mask during plating. Amorphous magnetic alloy shield materials are generally incompatible with such plating processes. In order to provide for patterning of the amorphous magnetic alloy shields, three possible alternative process types are possible. These include ion etching, chemical etching and lift-off processes.

SUMMARY OF THE INVENTION

Of the above three generic types of processes, it has been determined that a lift-off process is a highly desirably process to implement the pattering of amorphous shield materials. Accordingly, the present invention provides for a lift-off process for patterning bottom shields which are employed in thin film magnetic recording heads. The lift-off process comprises the steps of providing a substrate and depositing a first layer of resist material on one surface of the substrate. A transfer layer is deposited on top of the first layer of resist material and a second layer of resist material is deposited on top of the transfer layer.

The second layer of resist material is then patterned and the patterned structure is etched to form a mask structure wherein the transfer layer overhangs the first layer of resist. An amorphous magnetic alloy material is then deposited on the exposed surface of the substrate. Finally, the resist materials, transfer layer and unwanted amorphous alloy are removed.

The step of depositing the first layer of resist material includes heating the material to a predetermined elevated temperature of about 120 degrees Celsius. The transfer layer is typically sputtered onto the underlying layer at a minimum pressure of 10 milliTorr. The second layer of resist material is typically spun onto the top surface of the transfer layer and photolithographically patterned using a negative image mask.

The step of etching the patterned structure comprises the steps of etching through the exposed transfer layer using carbon tetrafluoride plasma, etching a vertical wall trough in the first layer of resist material in an oxygen-carbon tetrafluoride plasma, etching the first layer of photoresist to form an overhang structure using oxygen-sulfur hexafluoride plasma, and cleaning the the exposed surfaces using an argon-oxygen-carbon tetrafluoride plasma.

An adhesion layer is deposited by sputtering prior to the deposition of the amorphous magnetic alloy shield. The adhesion layer typically comprises a layer of hafnium. The step of removing the layer of resist, transfer layer and excess amorphous alloy is accomplished by ultrasonic agitation in acetone.

The above processing steps are highly reproducible since they employ dry processing technology, namely reactive ion etching and sputtering. The processing is compatible with multi-wafer batch processes. Tapered sidewall profiles of the shields are achieved which enhance the reliability of subsequently deposited metallization. Also, contrary to chemical etching, narrow linewidths, such as are required for photolithographic alignment marks, are reproduced by the lift-off process. In addition, the use of hafnium enhances adhesion of the amorphous magnetic material to the underlying substrate. The 120 degree Celsius baking temperature of the first resist layer enables the lift-off process to be performed in acetone while simultaneously eliminating resist reflow during subsequent processing.

BRIEF DESCRIPTION OF THE DRAWING

The various features and advantages of the present invention may be more readily understood with reference to the following detailed description taken in conjunction with the accompanying drawing, wherein like reference numerals designate like structural elements, and in which.

DETAILED DESCRIPTION

Figure 1A:
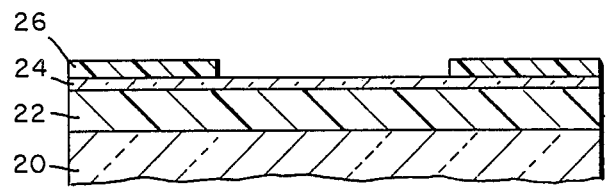
FIGS. 1a–c illustrate the process steps in fabricating shields comprising amorphous magnetic alloy material in accordance with the principles of the present invention.

Referring to FIG. 1a, a substrate 20, which may be a nonconducting oxide material, such as alumina, or the like, is provided, onto which is deposited a first layer of photoresist 22. Typical of such a photoresist is type AZ4210 manufactured by Azoplate, or the like. The first layer of photoresist 22 is deposited to a thickness of about 2.5 micrometers. A transfer layer 24, which may be comprised of a dielectric material such as silicon dioxide, or the like, is deposited on the exposed surface of the first layer of photoresist 22. A second layer of photoresist 26 is then deposited on the exposed surface of the transfer layer 24.

The first layer of photoresist 22 is spun on in a conventional manner and baked, or heated on a hotplate, for example, to a temperature of 120 degrees Celsius for a period of 5 minutes. The transfer layer 24 is vacuum deposited under low stress conditions wherein the stress is less than about $1 \times 10^9$ dynes per square centimeter. Such conditions typically require that the pressures used in the deposition step are greater than a minimum pressure of about 10 milliTorr (mT). The second layer of photoresist 26 is spun on in a conventional manner and baked, or heated on a hotplate, for example, at a temperature of 85 degrees Celsius for a period of 5 minutes.

The second layer of photoresist 26 is then patterned in a conventional manner using a photolithographic process commonly employed in wafer processing. A negative image mask is employed in the patterning step.

The patterned structure is then etched using a reactive ion etching procedure. This procedure comprises the steps of etching through the exposed transfer layer using carbon tetrafluoride plasma, etching a vertical wall trough in the first layer of photoresist 22 in an oxygen-carbon tetrafluoride plasma, etching the first layer of photoresist 22 to form an overhanging transfer layer using using oxygen-sulfur hexafluoride plasma, and cleaning the the exposed surfaces using an argon-oxygen-carbon tetrafluoride plasma. FIG. 1a illustrates the structure achieved after the patterning and development of the second layer of photoresist 26 has been accomplished.

Figure 1B:
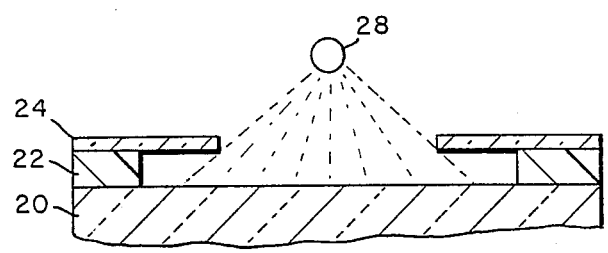

Referring to FIG. 1b, it illustrates the structure achieved after the above-described etching procedure has been accomplished. The extent of the undercut below the transfer layer 24 achieved by the etching procedure is about 4 pmicrometers. This etched structure is placed in a sputtering chamber having a sputtering source 28, wherein an adhesion layer 30 (shown in FIG. 1c), which may comprise hafnium, or the like is deposited on the exposed surface of the substrate 20. The layer of hafnium is typically deposited to a thickness of about 25 nanometers. Then an amorphous magnetic alloy material 32 (shown in FIG. 1c) is sputter deposited on top of the adhesion layer 30. To preclude stress-induced damage to the underlying resist pattern, the amorphous alloy material 32 is deposited with a stress level less than $10^9$ dynes per square centimeter. A deposition pressure of about 3.4 mT provides such a stress state. Typical of such an amorphous magnetic alloy material 32 is Cobalt hafnium Niobium (CoHfNb), and it is deposited to a thickness of about 2 micrometers. The sidewall structure of the sputtered amorphous magnetic alloy material 32 has a gradually sloping profile which enhances a subsequently deposited conductor metallization.

Figure 1C:
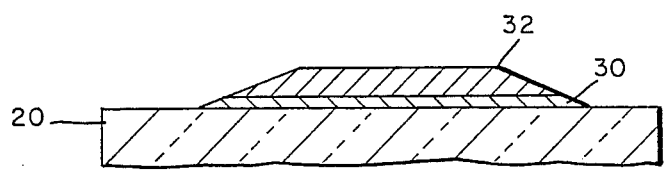

Subsequent to the deposition of the amorphous magnetic alloy material 32, the first layer of photoresist 22, transfer layer and residue of the amorphous alloy material 32 are removed by ultrasonic agitation in acetone. FIG. 1c shows the structure achieved after deposition of the amorphous magnetic alloy material 32 and removal of the masking and residue materials.

The above-described process provides for tapered sidewalls of the amorphous magnetic alloy material 32 which have a maximum slope of about 45 degrees. In order to avoid buckling at the interface between the first layer of photoresist and the transfer layer, the transfer layer is deposited with a stress less than about $1 \times 10^9$ dynes per square centimeter. This is accomplished by sputtering at a minimum system pressure of 10 mT.

A sputtering source 28 is shown in FIG. 1b and illustrates that deposition of the amorphous magnetic alloy material 32 does not impinge upon the vertical sidewalls formed in the first layer of photoresist 22. This, of course, is achieved by the overhanging mask structure created by the transfer layer 24. It is important that the deposition of the amorphous magnetic alloy material 32 does not impinge on the sidewalls of the transfer layer 24, since such impingement would create an unwanted build up of the amorphous magnetic alloy material. Such a build up would cause deleterious effects in the finalized recording head, as is well-known in the art. In particular, an undesirable ridge is left around the periphery of the pattern. If the build up is excessive, problems are created for conductors that traverse the shield boundary. Also, the 120 degree Celsius baking temperature of the first layer of photoresist 22 is necessary to enable the lift-off process to be performed in acetone while simultaneously eliminating resist reflow during subsequent processing.

The above processing steps are highly reproducible since they employ dry processing technology, namely reactive ion etching and sputtering. The processing is compatible with multi-wafer batch processes. Tapered sidewall profiles of the shields are achieved which enhance the reliability of subsequently deposited conductor metallization. Also, narrow linewidths, such as those required for photolithographic alignment are reproduced by this lift-off process. In addition, the use of hafnium enhances adhesion of the amorphous magnetic material to the underlying substrate.

Thus there has been described a new and improved process which employs a lift-off technique for patterning bottom shields used in fabricating thin film recording heads. It is to be understood that the above-described process is merely illustrative of some of the many specific process embodiments which represents applications of the principles of the present invention. Clearly, numerous and other arrangements can be readily devised by those skilled in the art without departing from the scope of the invention.

What is claimed is:

1. A lift-off process for patterning shields employed in thin film magnetic recording heads, said lift-off process comprising the steps of:
    providing a substrate;
    depositing a first layer of resist material on a surface of the substrate;
    depositing a transfer layer on the exposed surface of the first layer of resist material;
    depositing a second layer of resist material on the exposed surface of the transfer layer;
    patterning and developing the second layer of resist material;
    etching the patterned structure to form a mask structure wherein the transfer layer overhangs the first layer of resist material;
    depositing an amorphous magnetic alloy material on the exposed surface of the substrate; and
    removing the first layer of resist material, the transfer layer and excess amorphous alloy material.

2. The process of claim 1 wherein the step of depositing the first layer of resist material comprises depositing the resist material and heating the deposited resist material at a temperature of about 120 degrees Celsius.

3. The process of claim 1 wherein the step of depositing the transfer layer comprises sputtering the transfer layer at a minimum pressure of 10 mT.

4. The process of claim 1 wherein the step of depositing the second layer of resist material comprises spinning the layer onto the exposed surface of the transfer layer and photolithographically patterning the layer using a negative image mask.

5. The process of claim 1 wherein the step of etching the patterned structure comprises the steps of:
    etching through the exposed transfer layer using carbon tetrafluoride plasma;
    etching a vertical wall trough in the first layer of resist material in an oxygen-carbon tetrafluoride plasma;
    etching the first layer of resist material to form the mask structure using oxygen-sulfur hexafluoride plasma; and
    cleaning the exposed surfaces using an argon-oxygen-carbon tetrafluoride plasma.

6. The process of claim 1 wherein the step of depositing the amorphous magnetic alloy material comprises depositing the material using a deposition pressure of about 3.4 mT to provide a stress level in the material of less than $10^9$ dynes per square centimeter.

7. The process of claim 1 wherein the step of depositing the amorphous magnetic alloy material comprises depositing an adhesion layer on the surface of the substrate and sputtering the amorphous magnetic alloy material onto the adhesion layer.

8. The process of claim 7 wherein the step of depositing the adhesion layer comprises depositing a layer of hafnium.

9. The process of claim 1 wherein the step of removing the first layer of resist material, transfer layer and excess amorphous alloy material comprises removal by ultrasonic agitation in acetone.

10. A lift-off process for patterning shields employed in thin film magnetic recording heads, said lift-off process comprising the steps of:
providing a substrate;
depositing a first layer of resist material on a surface of the substrate;
depositing a transfer layer on the exposed surface of the first layer of resist material;
depositing a second layer of resist material on the exposed surface of the transfer layer;
patterning and developing the second layer of resist material;
etching the patterned structure to form a mask structure wherein the transfer layer overhangs the first layer of resist material, comprising the steps of:
etching through the exposed transfer layer using carbon tetrafluoride plasma;
etching a vertical wall trough in the first layer of resist material in an oxygen-carbon tetrafluoride plasma;
etching the first layer of resist material to form the mask structure using oxygen-sulfur hexafluoride plasma; and
cleaning the exposed surfaces using an argon-oxygen-carbon tetrafluoride plasma;
depositing an amorphous magnetic alloy material on the exposed surface of the transfer; and
removing the first layer of resist material, the transfer layer and excess amorphous alloy material.

11. A lift-off process for patterning shields employed in thin film magnetic recording heads, said lift-off process comprising the steps of:
providing a substrate;
depositing a first layer of resist material on a surface of the substrate and heating to at a predetermined elevated temperature;
depositing a transfer layer on the exposed surface of the first layer of resist material by sputtering the transfer layer at a minimum sputtering pressure of 10 mT;
depositing a second layer of resist material on the exposed surface of the transfer layer;
patterning and developing the second layer of resist material;
etching the patterned structure to from a mask structure wherein the transfer layer overhangs the first layer of resist material;
depositing an amorphous magnetic alloy material on the exposed surface of the substrate; and
removing the first layer of resist material, the transfer layer and excess amorphous alloy material.

12. The process of claim 11 wherein the step of etching the patterned structure comprises the steps of:
etching through the exposed transfer layer using carbon tetrafluoride plasma;
etching a vertical wall trough in the first layer of resist material in an oxygen-carbon tetrafluoride plasma;
etching the first layer of resist material to form the mask structure using oxygen-siliconfluoride plasma; and
cleaning the exposed surfaces using an argon-oxygen-carbon tetrafluoride plasma.

13. The process of claim 11 wherein the step of depositing the amorphous magnetic alloy material comprises depositing the material using a deposition pressure of about 3.4 mT to provide a stress level in the material of less than $10^9$ dynes per square centimeter.

14. The process of claim 11 wherein the step of depositing the amorphous magnetic alloy material comprises depositing an adhesion layer on the surface of the substrate and sputtering the amorphous magnetic alloy material onto the adhesion layer.

15. The process of claim 14 wherein the step of depositing the adhesion layer comprises depositing a layer of hafnium.

16. A lift-off process for patterning shields employed in thin film magnetic recording heads, said lift-off process comprising the steps of:
providing a substrate;
depositing a first layer of resist material on a surface of the substrate and heating to at a predetermined elevated temperature;
depositing a transfer layer on the exposed surface of the first layer of resist material by sputtering the transfer layer at a minimum sputtering pressure of 10 mT;
depositing a second layer of resist material on the exposed surface of the transfer layer;
patterning and developing the second layer of resist material;
etching the patterned structure to form a mask structure wherein the transfer layer overhangs the first layer of resist material, comprising the steps of:
etching through the exposed transfer layer using carbon tetrafluoride plasma;
etching a vertical wall trough in the first resist material in an oxygen-carbon tetrafluoride plasma;
etching the first layer of resist material to form the mask structure using oxygen-sulfur hexafluoride plasma; and
cleaning the exposed surfaces using an argon-oxygen-carbon tetrafluoride plasma;
depositing an amorphous magnetic alloy material on the exposed surface of the substrate; and
removing the first layer of resist material, the transfer layer and excess amorphous alloy material.

17. A lift-off process for patterning bottom shields having tapered sidewalls for use in thin film magnetic recording heads, said lift-off process comprising the steps of:
providing a nonconducting substrate;
depositing a first layer of resist material on a surface of the substrate at a predetermined temperature;
depositing a transfer layer on the exposed surface of the first layer of resist material at a predetermined pressure;
depositing a second layer of resist material on the exposed surface of thetransfer layer;
patterning and developing the second layer of resist material;
etching the patterned structure using reactive ion etching to form a mask structure wherein the transfer layer overhangs the first layer of resist material;
depositing an amorphous magnetic alloy material on the exposed surface of the substrate; and
removing the resist material, transfer layer and excess amorphous alloy material.

18. A lift-off process for patterning bottom shields having tapered sidewalls for use in thin film magnetic recording heads, said lift-off process comprising the steps of:

provaiding a nonconducting substrate;

depositing a first layer of resist material on a surface of the substrate at a predetermined temperature;

depositing a transfer layer on the exposed surface of the first layer of resist material at a predetermined pressure;

depositing a second layer of resist material on the exposed surface of the transfer layer;

patterning and developing the second layer of resist material;

etching the patterned structure using reactive ion etching to form a mask structure wherein the transfer layer overhangs the first layer of resist material, said etching step comprising the steps of:

etching through the exposed transfer layer using carbon tetrafluoride plasma;

etching a vertical wall trough in the first layer of resist material in an oxygen-carbon tetrafluoride plasma;

etching the first layer of resist material to form an overhang structure using oxygen-sulfur hexafluoride plasma; and cleaning the the exposed surfaces using an argon-oxygen-carbon tetrafluoride plasma;

depositing an amorphous magnetic alloy material on the exposed surface of the substrate; and removing the resist material, transfer layer and excess amorphous alloy material.

19. The process of claim 18 wherein the step of depositing the first layer of resist material comprises depositing the resist material and heating the deposited resist material at a temperature of about 120 degrees Celsius.

20. The process of claim 18 wherein the step of depositing the transfer layer comprises sputtering the transfer layer at a minimum pressure of 10 mT.

21. The process of claim 18 wherein the step of depositing the amorphous magnetic alloy material comprises depositing the material using a deposition pressure of about 3.4 mT to provide a stress level in the material of less than $10^9$ dynes per square centimeter.

22. The process of claim 19 wherein the step of depositing the amorphous magnetic alloy material comprises depositing the material using a deposition pressure of about 3.4 mT to provide a stress level in the material of less than $10^9$ dynes per square centimeter.

23. The process of claim 18 wherein the step of depositing the amorphous magnetic alloy material comprises depositing an adhesion layer on the surface of the substrate and sputtering the amorphous magnetic alloy material onto the adhesion layer.

24. The process of claim 23 wherein the step of depositing the adhesion layer comprises depositing a layer of hafnium.

* * * * *

UNITED STATES PATENT AND TRADEMARK OFFICE
CERTIFICATE OF CORRECTION

PATENT NO. : 4,853,080

DATED : August 1, 1989

INVENTOR(S) : Thomas C. Anthony

It is certified that error appears in the above-identified patent and that said Letters Patent is hereby corrected as shown below:

On the title page:

The title, "Lift-Off Process For Patterning Shields in Thin Magnetic Recording Heads" should read --- Lift-Off Process For Patterning Shields in Thin-Film Magnetic Recording Heads ---;

Column 1, Line 2-3, "Lift-Off Process For Patterning Shields in Thin Magnetic Recording Heads" should read --- Lift-Off Process For Patterning Shields in Thin-Film Magnetic Recording Heads ---;

Column 6, Line 36, "etching a vertical wall trough in the first of resist" should read --- etching a vertical wall trough in the first layer of resist ---;

Abstract [57], Line 17, "condition that resists the stress..." should read --- condition that restricts the stress... ---;

Column 5, Line 34, "the exposed surface of the transfer; and" should read --- the exposed surface of the transfer layer; and ---;

UNITED STATES PATENT AND TRADEMARK OFFICE
CERTIFICATE OF CORRECTION

PATENT NO. : 4,853,080

DATED : August 1, 1989

INVENTOR(S) : Thomas C. Anthony

It is certified that error appears in the above-identified patent and that said Letters Patent is hereby corrected as shown below:

Column 5, Line 67, "mask structure using oxygen-siliconfluoride" should read --- mask structure using an oxygen sulfer hexafluoride ---.

Signed and Sealed this

Fifteenth Day of January, 1991

Attest:

HARRY F. MANBECK, JR.

*Attesting Officer*      *Commissioner of Patents and Trademarks*